United States Patent
Mitsuhashi

[11] Patent Number: 5,902,132
[45] Date of Patent: May 11, 1999

[54] METHOD OF MANUFACTURING A SEMICONDUCTOR DEVICE INCLUDING A PROCESS OF FORMING A CONTACT HOLE

[75] Inventor: Toshiro Mitsuhashi, Tokyo, Japan

[73] Assignee: Oki Electric Industry Co., Ltd., Tokyo, Japan

[21] Appl. No.: 08/848,641

[22] Filed: Apr. 29, 1997

[30] Foreign Application Priority Data

Dec. 10, 1996 [JP] Japan .................................. 08-346762

[51] Int. Cl.$^6$ .................................................. H01L 21/44
[52] U.S. Cl. ........................ 438/666; 438/672; 438/634; 148/DIG. 20
[58] Field of Search ........................... 438/618, 620–621, 438/629, 634, 637–640, 666–668, 672, 675; 148/DIG. 20

[56] References Cited

U.S. PATENT DOCUMENTS 4,997,790  3/1991  Woo et al. .
5,705,427  1/1998  Chan et al. .

OTHER PUBLICATIONS

K.H. Küsters et al., "A High Density 4Mbit dRAM Process Using a Fully Overlapping Bitline Contact (FoBIC) Trench Cell", 1987, pp. 93–94.

Primary Examiner—Jey Tsai
Attorney, Agent, or Firm—VENABLE; Robert J. Frank

[57] ABSTRACT

A relatively easy manufacturing method of a semiconductor device enabling a contact hole 25 to be formed reliably by self alignment without exposing a gate 11, wherein a plug 20 is adopted to protect an etching stopper film 16 from an etching gas when a preliminary opening 24 is formed by etching an insulating film 22 having an electrical insulating etching stopper film 16 embedded therein.

8 Claims, 11 Drawing Sheets

METHOD OF MANUFACTURING A SEMICONDUCTOR DEVICE INCLUDING A PROCESS OF FORMING A CONTACT HOLE

BACKGROUND OF THE INVENTION

1. Field of the Invention

The present invention relates to a method of manufacturing a semiconductor device, such as an IC chip, and more particularly to a method of manufacturing a semiconductor device, including a forming process of a so-called contact hole formed to pass through an insulating film and open above the semiconductor substrate.

2. Prior Art

The forming process of contact holes is one of the processes involved in the manufacture of integrated circuits, including IC chips. The contact hole is formed as an empty area which passes through an insulating film covering a semiconductor substrate, for example, and opens above the semiconductor substrate, and in this empty area an electrode path can be provided.

The contact hole described above can be formed by an etching technique using a photolithographically delineated resist pattern as the mask. Meanwhile, to meet a growing demand for higher density devices, there is a newly proposed SAC method for forming a contact hole by a self-aligned technique.

According to this method of forming a self-aligned contact hole, for example, which is open above the semiconductor substrate between a pair of gates, are formed in the insulating film covering the pair of gates formed on the semiconductor substrate separated apart from each other.

By this method of forming a self-aligned contact hole, an etching stopper film having electrical insulating properties is formed to cover the pair of gates on the semiconductor substrate and the exposed surfaces of the semiconductor substrate. Then, an insulating film is deposited to have the pair of gates and the etching stopper film covering the gates embedded in it.

Subsequently, by an etching technique using a lithographically-formed resist pattern as the mask, a preliminary opening is formed to have partially exposed an etching stopper film which covers an area between a pair of gates where a contact hole is to be formed. That portion of the etching stopper film which is exposed on the semiconductor substrate is removed by a self-aligned method, that is, directly by dry etching with a plasma gas without using a mask.

By this self aligned method, the preliminary opening can be formed appropriately in the insulating film without causing a substantial damage to the etching stopper film by performing etching with an etching gas which shows a higher etch rate of the insulating film covering the etching stopper film than the etch rate of the etching stopper film, in other words, by performing etching with such an etching gas as shows a large selectivity ratio of the insulating film to the etching stopper film in the forming process of the preliminary opening.

Therefore, by subsequent dry etching of the etching stopper film without a mask, a minute opening can be formed without the need to consider design allowances for mask positioning, so that this method can conform to geometrical design rules so tight as a unit spacing of 0.25 micron.

However, with an etching gas used to partially expose the etching stopper film by forming the preliminary opening in the insulating film, the insulating film/etching stopper film selectivity is no more than 20 or so. Therefore, during etching to form the preliminary opening, the etching stopper film, too, is liable to be damaged by the etching gas.

For this reason, when the predetermined preliminary opening is formed, the gates should be covered with the etching stopper film which serves as electrical protection means, and if the etching step is not finished before the etching stopper film suffers a substantial damage, there is a possibility that the gates under the etching stopper film are exposed.

This exposure of the gates leads to a short circuit between the electrode to be formed in the contact hole and the exposed gate. To prevent a short circuit, the etching work to form the preliminary opening needs to be terminated without fail before the etching stopper film suffers a considerable damage. Consequently, in the conventional semiconductor device manufacturing method including the contact hole forming step using a self-aligned technique has been difficult because meticulous care is indispensable for management of the etching process.

With the progressive microminiaturization of the patterns due to the increasing device integration, while the aspect ratio, that is, the ratio of the depth to the bore diameter of the contact hole becomes larger, the etch rate of the insulating film in the contact hole portion slows down by the microloading effect, so that the insulating film/etching stopper film selectivity of the etching gas further decreases. The result is that the etching stopper film is more liable to be damaged during the formation of the preliminary opening.

SUMMARY OF THE INVENTION

Therefore, the object of the present invention is to provide an easy method of manufacturing a semiconductor device, including a step of securely forming a contact hole without exposing the gates by using the self-aligned technique.

In order to solve the above-mentioned problems, the present invention is based on the basic idea of adopting a plug for protecting the etching stopper film from an etching gas when forming the preliminary opening by etching the insulating film which has the electrical insulating etching stopper film embedded therein.

According to the present invention, there is provided a method of manufacturing a semiconductor device, including a process of forming a contact hole, opened on a semiconductor substrate between a pair of gates, in an insulating film having embedded therein at least a pair of gates formed spaced apart from each other on the semiconductor substrate, wherein first of all an etching stopper film showing electrical insulating properties is formed to cover the pair of gates on the semiconductor substrate and the exposed surfaces of the semiconductor substrate. Then, a recess covered with the etching stopper film and defined by the pair of gates is filled with a plug.

Next, the insulting film is formed to have the etching stopper film and the plug formed partially on the etching stopper film embedded therein. A preliminary opening having the plug exposed thereto is formed in the insulating film by etching the insulating film with a first etching gas having an insulating film/plug selectivity of 20, for example, (in other words, the etch rate ratio is 20:1) and with a mask.

Further, the plug exposed to the preliminary opening is etched away completely with a second etching gas having a higher selectivity ratio of the plug to the insulating film and the stopper film than the selectivity ratio of the insulating film to the plug of the first etching gas. That portion of the etching stopper film which was exposed when the plug was etched away and which is located on the semiconductor substrate is removed with a third etching gas having a higher etch selectivity ratio of the etching stopper film to the semiconductor substrate, whereby a contact hole open above the semiconductor substrate is formed.

By the semiconductor device manufacturing method according to the present invention, the recess covered with the etching stopper film and defined between the pair of gates is filled with the plug, and then the plug and the etching stopper film are embedded in the insulating film.

In the formation of the preliminary opening with the first etching gas, that portion of the etching stopper film which is located under the plug and protected thereby is not damaged by the first etching gas even if the first etching gas shows the insulating film/plug selectivity of 20, for example, as in the preceding example.

Therefore, the specified portion of the etching stopper film which is under the plug is reliably protected from the first etching gas used for forming the preliminary opening, and because of this, the preliminary opening is formed appropriately without damaging the specified portion of the etching stopper.

After the preliminary opening is formed, the plug is etched away with the second etching gas. The second etching gas has a higher etch selectivity ratio of the plug to the insulating film and the etching stopper film than the etch selectivity ratio of the insulating film to the plug of the first etching gas. In other words, though the etching stopper film is exposed by the removal of the plug, the second etching gas, which exposes the etching stopper film by removing the plug, exhibits a higher plug/stopper film selectivity ratio higher than the insulating film/stopper film selectivity ratio in the prior-art contact hole forming technique.

For this reason, the plug can be removed relatively easily without causing a substantial damage to the insulating film and the etching stopper film.

The etching stopper film, which is exposed to the preliminary opening by removal of the plug, is removed by etching with the third etching gas. The third etching gas shows a higher etch rate of the etching stopper film than the etch rate of the semiconductor substrate, which is appropriate for preserving the semiconductor substrate.

Therefore, after that portion of the etching stopper film which is located on the semiconductor substrate is removed, the exposed semiconductor substrate is not so much marred by the third etching gas as to immediately suffer a substantial damage. Consequently, the etching stopper film is selectively removed without any effects on the semiconductor substrate, so that a contact hole is formed which is open above the semiconductor substrate.

Thus, when the preliminary opening is formed in the insulating film, the etching stopper film to protect the gates from an electrical short-circuit is protected by the plug against the first etching gas, with the result that the etching stopper film is not so much damaged as it was conventionally damaged when the preliminary opening was formed.

To reliably protect the top surfaces of the gates by the plug, an upwardly extending shoulder portion can be added to the plug.

When a protective film is formed in advance on the top surface of each gate to protect against etching, the shoulder portion of the gate can be dispensed with. By obviating the shoulder portion, the occurrence of a hollow in the insulating film after removal of the shoulder can be reliably prevented, which results from a misalignment of the shoulder portion.

When the semiconductor substrate is a silicon substrate, the plug may be formed of polysilicon, and the insulating film may be formed of silicon oxide, such as silicon dioxide, phospho-silicate glass (PSG), or boron-doped phospho-silicate glass (BPSG).

When the protective film is a silicon oxide film, a silicon nitride film may be adopted for the etching stopper film.

When the protective film is a silicon nitride film, a silicon oxide film may be adopted for the etching stopper film.

When the etching stopper film is a silicon nitride film, as the first etching gas, a plasma gas, including CF4, CHF3 and Ar, may be used, as the second etching gas, a plasma gas, including SF6, may be used, and as the third etching gas, a plasma gas, including CF4 and O2, may be used.

When the etching stopper film is a silicon oxide film, the first etching gas may be used as the third etching gas.

DESCRIPTION OF PREFERRED EMBODIMENTS

The present invention will be described referring to the embodiments shown in the accompanying drawings.

FIGS. 1(a) to 1(j) are sectional views showing process steps of an example in which the semiconductor device manufacturing process according to the present invention is applied to the manufacture of a MOS transistor.

Figure 1A:
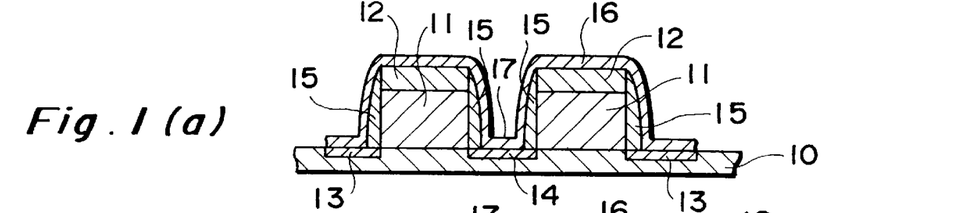
FIGS. 1(a) to 1(j) are sectional views showing a sequence of a semiconductor device manufacturing method according to the present invention.

In the method of manufacturing a MOS transistor according to the present invention, gates 11 of MOS transistors are formed, for example, on an n-type silicon semiconductor substrate 10 as shown in FIG. 1(a). The gates 11 are formed at least in a pair separated apart from each other using, for example, a pattern of silicon oxide (NSG) as a mask. On each gate 11, there remains the mask formed of this silicon oxide to be used as a protective layer 12, which will be described later.

By ion implantation using each gate 11 as the mask, impurities are implanted between the gates 11 into the semiconductor substrate 10, by which the source 13 and the drain 14 are formed. In the example illustrated, on the side portions of each gate 11, there are formed side wall portions 15 used as the mask in a secondary ion implantation by which to form a heavily doped center region in the source 13 and the drain 14, respectively. Therefore, when the secondary ion implantation is obviated, the side wall portions can be dispensed with. The side wall portions 15 can be formed of silicon oxide, for example, as is the case with the protective film 12.

The gates 11 and that portion of the surface of the semiconductor substrate 10 which is exposed between the gates 11 are covered with an etching stopper film 16. The etching stopper film 16 can be obtained by growing a silicon nitride film, for example, to a thickness of about 500 A.U. (angstrom unit) by chemical vapor deposition (CVD).

By the formation of this etching stopper film 16, a recess 17 covered with the etching stopper film 16 is defined between a pair of gates 11.

Figure 1B:
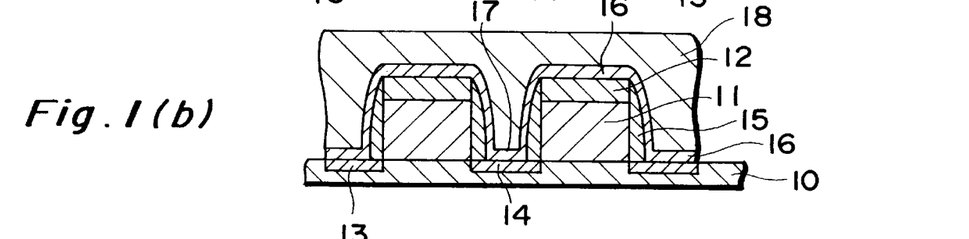

As shown in FIG. 1(b), polysilicon 18 is deposited to a thickness of about 2000 A.U. by CVD, for example, in such a way as to have the etching stopper film 16 and the recess 17 embedded in it. The polysilicon 18 is used as a forming material of a plug to be described later.

Figure 1C:
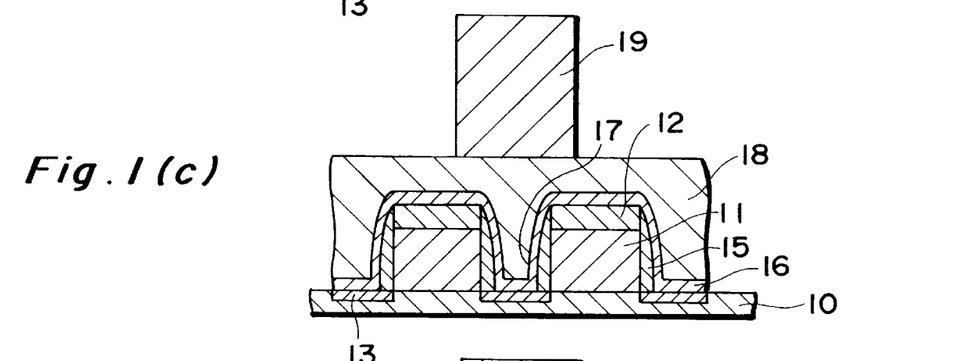

After the polysilicon 18 is formed, to form a plug made of this polysilicon, a resist pattern 19 as shown in FIG. 1(c) is formed by photolithography, for example. The resist pattern 19 is a circular pattern with a smaller outside diameter than the bore diameter of a preliminary opening to be described later, and is formed at an appropriate position above the recess 17.

Using the resist pattern 19 as the mask, the polysilicon 18 is subjected to dry etching by a plasma etching apparatus. As the etching gas for this drying etching, a plasma gas including SF6 and Cl2, for example, for etching the polysilicon 18 by a quasi-isotropic etch is preferably used.

Figure 1D:
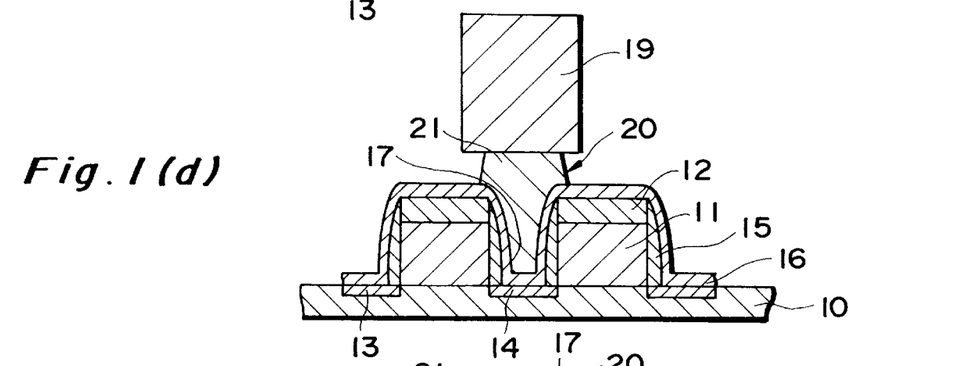

When a plug 20 made of polysilicon is formed between a pair of gates 11 as shown in FIG. 1(d) with an etching gas exhibiting a quasi-isotropy instead of using an etching gas exhibiting a substantially perfect isotropy to the polysilicon 18, the polysilicon 18 is reliably prevented from remaining at external side portions of the gates 11 opposite from the side portions facing the recess 17.

Figure 1E:
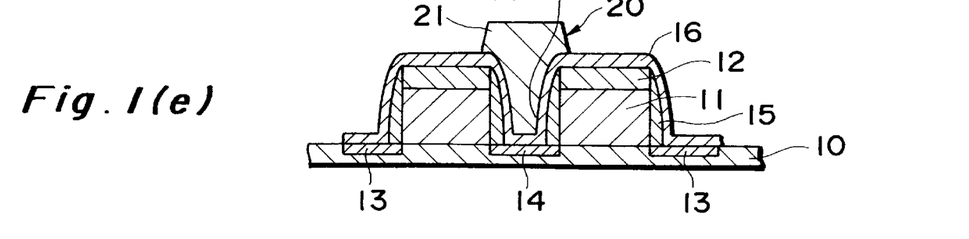

In the example in FIG. 1(d), the plug 20 has a shoulder portion 21 extending above the gates 11 with an intermediary of the etching stopper film 16. After the plug 20 is formed, the resist pattern 19 is removed with an asher. Subsequently, to remove the ashing residues, the surfaces of the plug 20 and the etching stopper film 16 are rinsed with a solution consisting of sulfuric acid and oxygenated water. Thus, the forming process of the plug 20 filling up the recess 17 defined between the pair of gates 11 and covered with the etching stopper film 16 is completed as shown in FIG. 1(e).

Figure 1F:
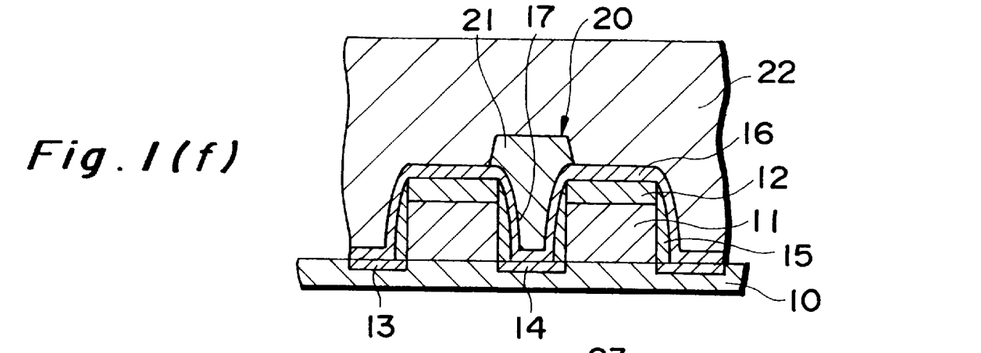

After the plug 20 is completed, as shown in FIG. 1(f), the etching stopper film 16 covering the gates 11 and the plug 20 are embedded again by depositing an insulating film 22 of BPSG, for example, including silicon oxide added with boron and phosphorus, for example. The insulating film 22 can be formed with a thickness of, for example, 5000 A.U. by CVD.

Figure 1G:
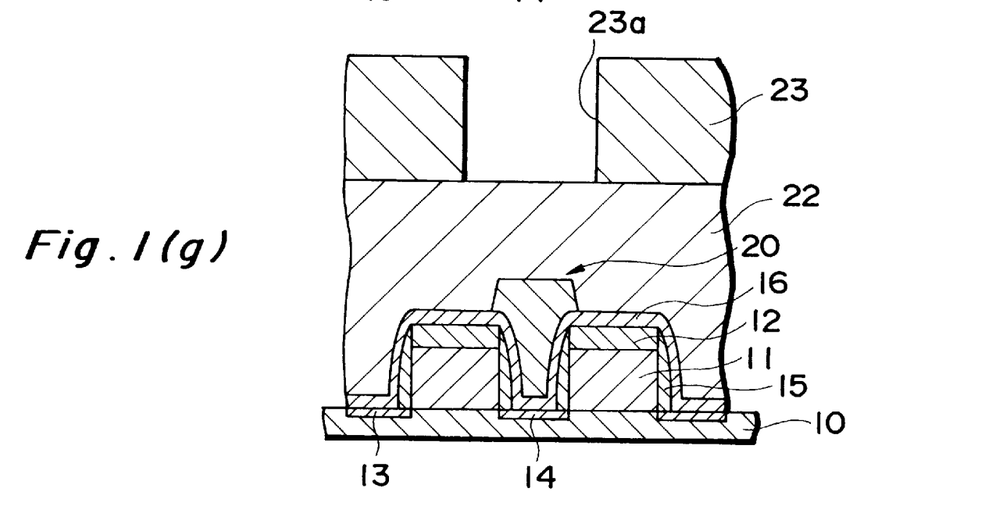
Figure 1H:
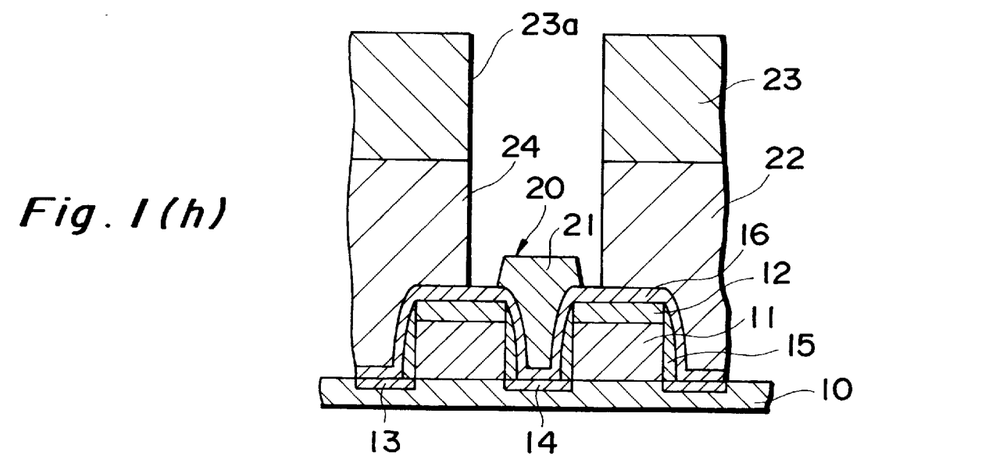

On the insulating film 22, a resist pattern 23 used to form a preliminary opening 24 (refer to FIG. 1(h)) is formed, for example, by photolithography as shown in FIG. 1(g). The resist pattern 23 has a shape with an inside diameter larger than the maximum diameter of the shoulder portion 21 and an inside diameter region 23a completely covers the shoulder portion 21.

To form the preliminary opening 24 in the insulating film 22 using the resist pattern 23 as the mask, anisotropic dry etching is performed. In this dry etching, a first etching gas is used, the properties of which are such that the etch rate of the insulating film 22 of silicon oxide is higher than the etch rate of the polysilicon plug 20 covering the etching stopper film 16, and the etch selectivity ratio of the insulating film to the plug 20 is 20:1, for example. As the first etching gas, a plasma gas including CF4, CHF3 and Ar, for example, can be used.

As described, since the etching stopper film 16 is protected by the plug 20 when the preliminary opening 24 is formed in the insulting film 22, the preliminary opening 24 can be formed appropriately without causing any damage to the etching stopper film 16 protected by the plug 20 as shown in FIG. 1(h).

In the example illustrated, a part of the etching stopper film 16 is exposed at the side of the shoulder portion of each plug 20, but those portions of the etching stopper film 16, which are directly concerned with short-circuit of the gates, which are liable to be damaged by the first etching gas, and which cover the upper side portions of the gates 11, are securely covered with the plug 20.

Therefore, the forming process of the preliminary opening 24 can be terminated timely the moment the plug 20 is exposed to the preliminary opening 24 without allowing the etching stopper film 16 to be substantially damaged.

Figure 1I:
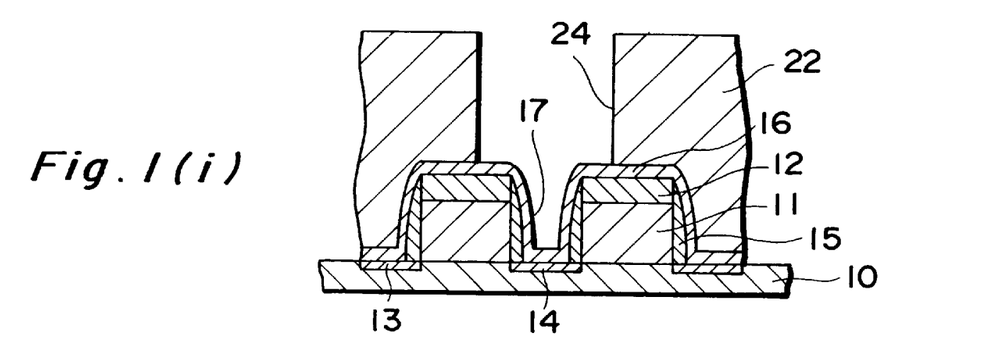

After the preliminary opening 24 is formed, the resist pattern 23 is removed by the same method using the asher as in the removal of the resist pattern 19. The plug 20 exposed to the preliminary opening 24 is removed by dry etching, whereby the side walls of the recess 17 are exposed to the preliminary opening 24 as shown in FIG. 1(i).

For the removal of the plug 20, a second etching gas is used. The second etching gas is such that it shows anisotropy and the etch rate of the polysilicon plug 20 than the etch rate of the insulating film 22 of silicon oxide and the etching stopper film 16 of silicon nitride. In other words, the second etching gas has a high plug/insulating film and etching stopper film selectivity ratio. A typical example of the second etching gas is a plasma gas including SF6.

The second etching gas described above shows a high plug selectivity ratio relative to the etching stopper film 16, more specifically, the plug selectivity is at least higher than 50. Therefore, only the plug 20 can be removed relatively easily without causing a substantial damage to the etching stopper film 16.

The etching stopper film 16, which is exposed to the preliminary opening 24 by the removal of the plug 20, receives an etching process with the third etching gas.

The third etching gas is such that it exhibits anisotropy and that the etch rate of the etching stopper film 16 formed of a silicon oxide film is higher than the etch rate of the semiconductor substrate 10 formed of a silicon crystal, in other words, the etch selectivity is high for the etching stopper film 16.

As the third etching gas, a plasma gas including CF4 and O2 can be used. With the third etching gas, compared with the etch rate of the etching stopper film 16, the etch rate is slow for both the insulating film 22 and the protective film 12 both formed of a silicon oxide film of almost the same quality as the semiconductor substrate 10.

Figure 1J:
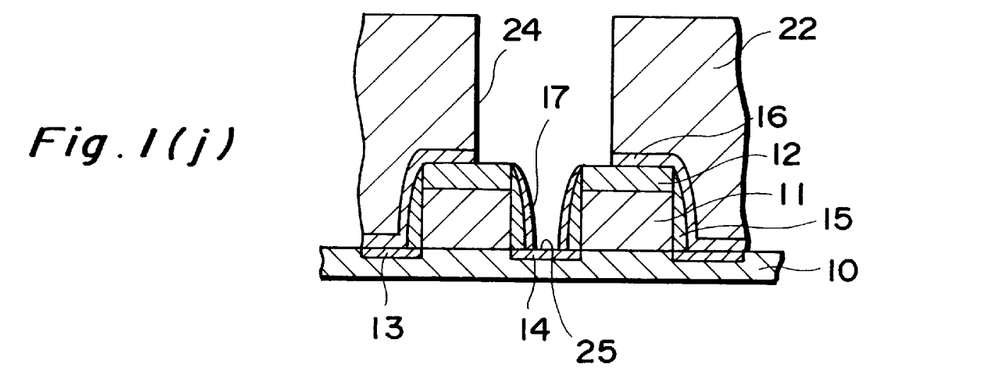

Consequently, as shown in FIG. 1(j), that portion of the etching stopper film 16 which is located on the semiconductor substrate 10 exposed at the recess 17 is removed, and the semiconductor substrate 10 opens at the drain 14, whereby a contact hole 25 including the preliminary opening 24 is completed.

By the third etching gas, those portions of the etching stopper film 16 which cover the areas above the gates 11 are partially removed. However, since the protective films 12 of the same quality as the insulating film 22 are provided above the gates 11, the protective films 12 do not suffer damage by the third etching gas and securely protect the top portions of the gates 11.

Thus, the opening can be formed by in a self-aligned manner without applying a mask directly on the etching stopper film 16 covering the semiconductor substrate 10 between the gates 11. Therefore, when forming the opening directly in the etching stopper film 16, micro processing can be done without any worry about errors in positioning the mask.

When the preliminary opening 24 is formed, the etching stopper film 16 is substantially protected by the plug 20, and is never damaged as it used to. Therefore, the final thickness loss of the etching stopper film 16 due to unexpected damage by the first and second etching processes can be limited to a small amount of 300 A.U., less than half as much as before. Consequently, an electrical short circuit between a metallic conductor 26 (see FIG. 4(c)) formed in the contact hole 25, and the gates 11 can be securely prevented relatively easily.

Instead of forming the protective films 12, the thickness of that portion of the etching stopper film 16 which covers the top surface of each gate 11 may be previously set at a larger value than the other portions of the etching stopper film 16 by taking into account a possible removed amount of thickness by etching with the third etching gas.

Meanwhile, the shoulder portion 21 of the plug 20 extending upwardly along the gates 11 may be removed in advance from the plug 20 protecting the etching stopper film 16 against the second etching gas when forming the preliminary opening 24 as shown in FIGS. 2(a) to 2(d) and FIGS. 3(a) to 3(c).

Figure 2A:
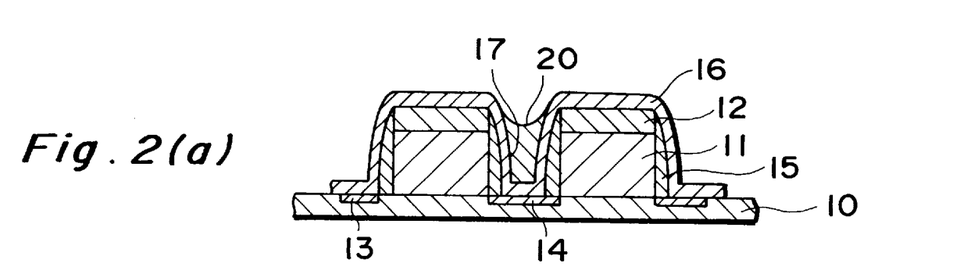
FIGS. 2(a) to 2(d) are sectional views showing a sequence of another semiconductor device manufacturing method according to the present invention.

More specifically, as shown in FIG. 1(e), after the polysilicon plug 20 having the shoulder portion 21 is formed and before the plug 20 is embedded again in the insulating film 22, the shoulder portion 21 is removed from the plug 20. A plasma gas including SF6 and Cl2 for anisotropic etching of its polysilicon material may be used. By removal of this shoulder portion 21, the plug 20 is shaped such that its height is almost the same as the gates 11 but lower than the portions of the etching stopper film 16 which cover the top surfaces of the gates 11 as shown in FIG. 2(a).

Figure 2B:
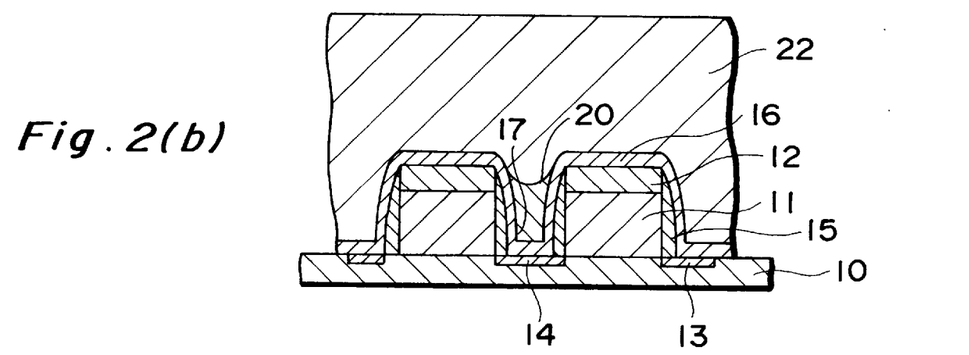
Figure 2C:
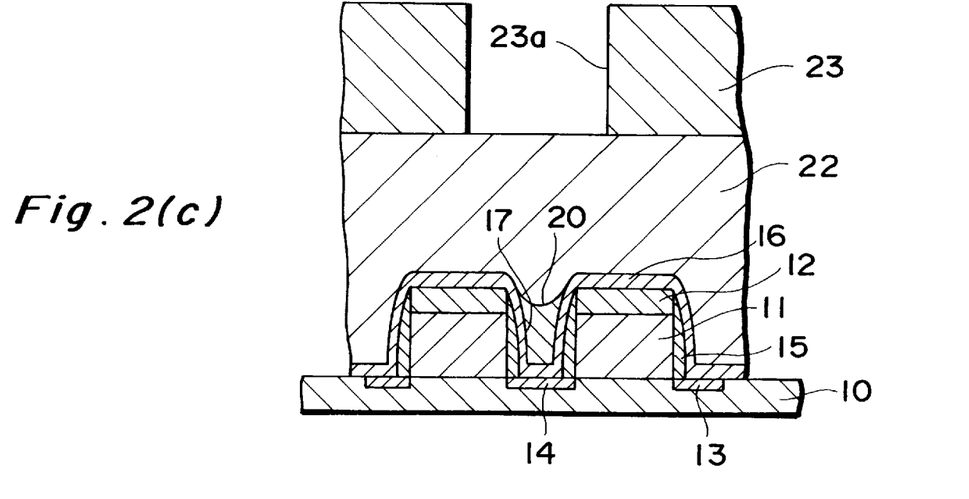
Figure 2D:
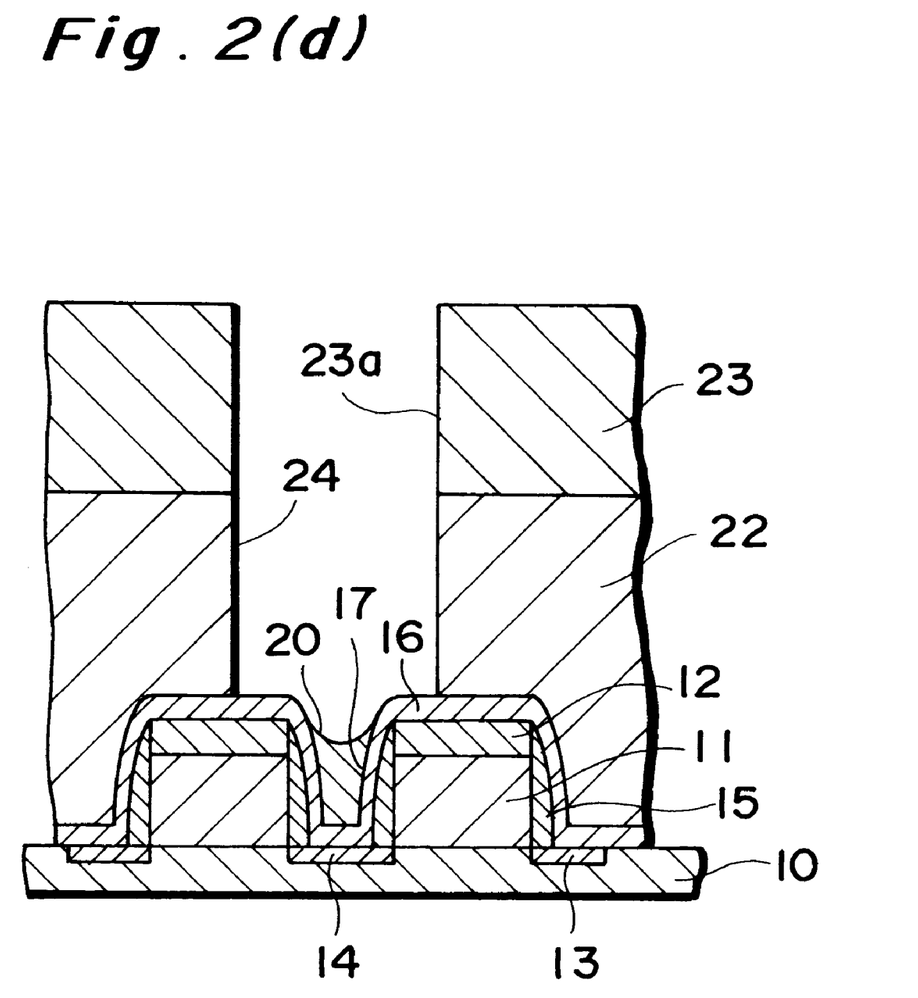

As shown in FIG. 2(b), as in the example shown in FIGS. 1(f) to 1(h), the plug 20 from which its shoulder portion was removed and the etching stopper film 16 covering the gates 11 are embedded again in an insulating film 22 of BPSG, for example. As shown in FIG. 2(c), a resist pattern 23 for a preliminary opening 24 is formed, and as shown in FIG. 2(d), the preliminary opening 24 is formed by dry etching by the first etching gas same as mentioned above using the resist pattern 23 as the mask.

When the preliminary opening 24 is formed, those portions of the etching stopper film 16, which are directly concerned with short-circuit of the gates, which are liable to be damaged by the first etching gas, and which cover the upper side portions of the gates 11, are securely covered with the plug 20.

Therefore, as in the example shown in FIGS. 1(a) to 1(j), the forming process of the preliminary opening 24 can be terminated timely the moment the plug 20 is exposed to the preliminary opening 24 without allowing the etching stopper film 16 to be substantially damaged.

After the preliminary opening 24 is formed, as in the example shown in FIGS. 1(i) and 1(j), the resist pattern 23 is removed, then by using the second plasma gas same as mentioned above, the plug 20 is removed effectively, and subsequently, by using the third plasma gas same as mentioned above, that portion of the etching stopper film 16 which covers the area above the semiconductor substrate 10 and which is exposed to the recess 17 is removed, whereby a contact hole 25 is formed which opens to the drain 14 in the semiconductor substrate 10, and which includes the preliminary opening 24.

Figure 3A:
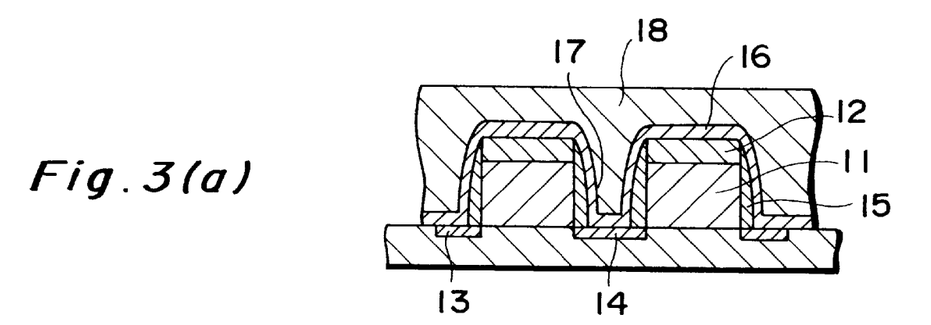
FIGS. 3(a) to 3(c) are sectional views showing a sequence of a further semiconductor device manufacturing method according to the present invention.
Figure 3B:
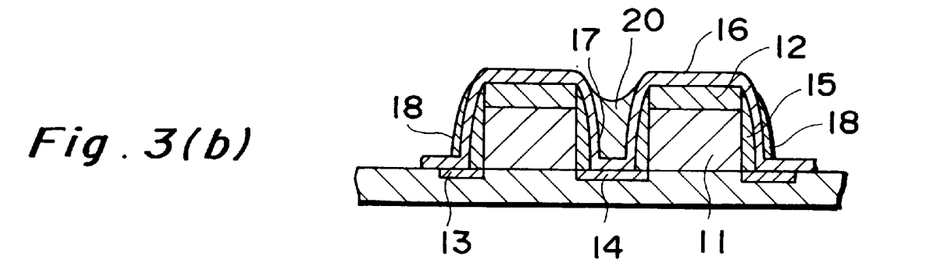
Figure 3C:
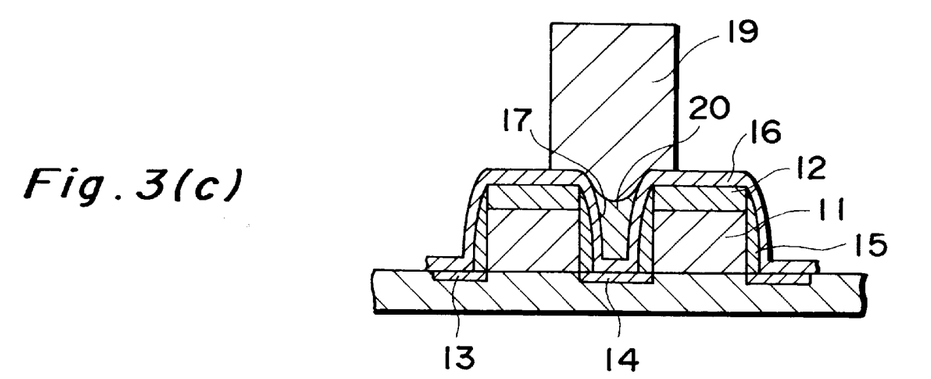

As shown in FIGS. 3(a) to 3(c), the plug 20 without its shoulder portion can be formed directly in the recess 17 between a pair of gates 11.

As shown in FIG. 3(a), after the etching stopper film 16 made of a silicon nitride film, for example, is formed which covers the surfaces of the pair of gates 11 and the semiconductor substrate 10, a polysilicon 18 is deposited to a thickness of about 2000 A.U. by CVD, for example.

Subsequently, using a plasma gas same as the second plasma gas mentioned above, etching is performed on the whole surface of the polysilicon 18 without applying a mask on the polysilicon 18. In this etching process, the removal rate of the polysilicon 20 by etching becomes far slower than in the other portions owing to the above-mentioned microloading effect and so on. For this reason, as shown in FIG. 3(b), the polysilicon remains in the recess 17 and the moment a plug 20 is obtained which is shaped such that the remaining polysilicon 18 is lower than those portions of the etching stopper film 16 which cover the top surfaces of the gates 11 and the height of the plug 20 is almost the same as the gates 11, the etching process is stopped.

When etching with a plasma gas same as the second plasma gas mentioned above is stopped, the polysilicon 18 occasionally persists along the outer side walls of the pair of gates 11 due to the anisotropy of the plasma gas. The remaining polysilicon 18 can be removed selectively by dry etching by an etching gas same as the second etching gas mentioned above by using a resist pattern 19 which is formed to cover the plug 20 as shown in FIG. 3(c) as a mask.

As described with reference to FIG. 2(a), when the shoulder portion only is removed from the plug 20 having the shoulder portion 21, if the etching area is small, there is a possibility that decisions vary as to when to stop etching.

However, in the example described referring to FIGS. 3(a) to 3(c), as mentioned above, because etching takes place on the whole surface of the polysilicon 18, the residual quantity of the polysilicon plug 20 can be decided as the quantity relative to the whole mass of the polysilicon 18. The plug 20, which has reached a predetermined residual quantity, is protected by the resist pattern 19, and the unwanted remaining portion of polysilicon 18 is removed. Therefore, the latter example is more favorable because the plug 20 without the shoulder portion 21 can be formed easily.

By adoption of the plug 20 without the shoulder portion 21, restrictions concerned with the relative position between the plug 20 and the preliminary opening 24 can be made lenient.

Figure 4A:
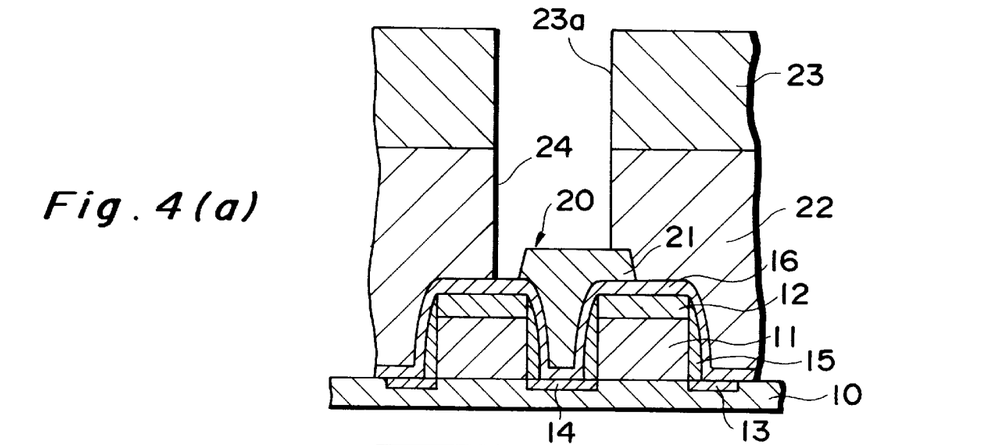
FIGS. 4(a) to 4(c) are sectional views showing a sequence of yet another semiconductor device manufacturing method according to the present invention.
Figure 4B:
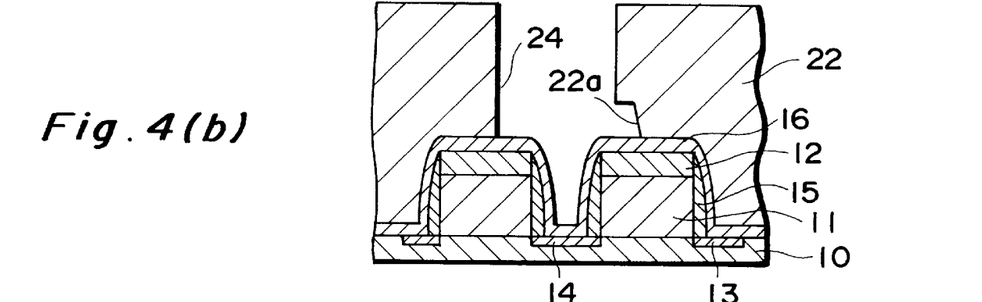

More specifically, as shown in FIG. 4(a), if the plug 20 having the shoulder portion 21 is formed extending beyond a predetermined area in the preliminary opening 24, as shown in FIG. 4(b), when the plug 20 is removed, on the inner wall, a hollow 22a is formed which extends radially as defined by the shoulder portion 21.

Figure 4C:
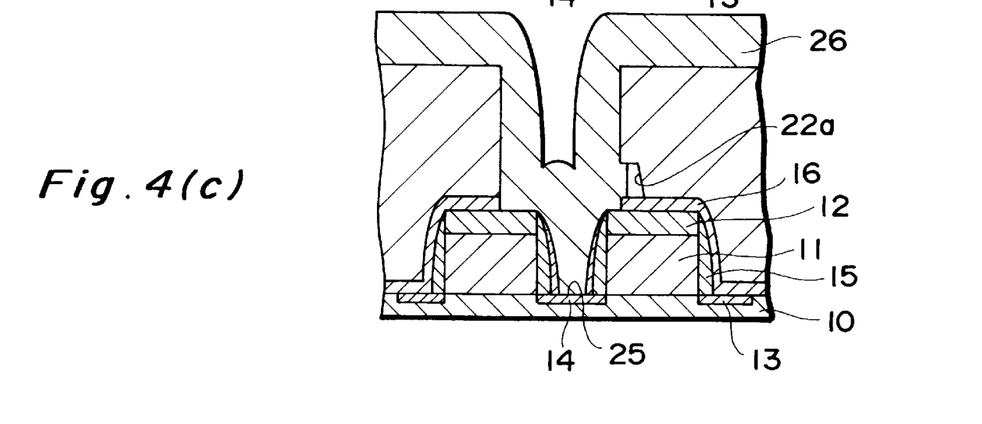

After the plug 20 is removed, as described above, by etching with the third etching gas, a contact hole 25 is completed as shown in FIG. 4(c). The inner surface of the contact hole 25 is covered with a metallic conductor 26 by sputtering, for example, but the hollow 22a is not filled with the metallic conductor 26 and remains as a gap conducive to a decrease in mechanical strength.

Therefore, for the plug 20 having the shoulder portion 21, the shape and the arrangement accuracy of the resist pattern 19 shown in FIGS. 1(c) and 1(d) and used for forming the plug 20 are extremely important, and they impose limits on alignment allowance in the photolithographic process.

On the other hand, with the plug 20 without the shoulder portion shown in FIGS. 2(a) to 2(d) and FIGS. 3(a) to 3(c), the plug 20 has only to be formed in the recess 17, and there is no need to impose rigid limits on the alignment allowance in the photolithographic process.

FIGS. 5(a) to 5(l) and FIGS. 6(a) to 6(c) show the example in which a silicon nitride film is used for the protective film 12. In FIGS. 5 and 6, the source 13 and the drain 14 in the semiconductor substrate 10 are omitted for simplicity of the drawings.

Figure 5A:
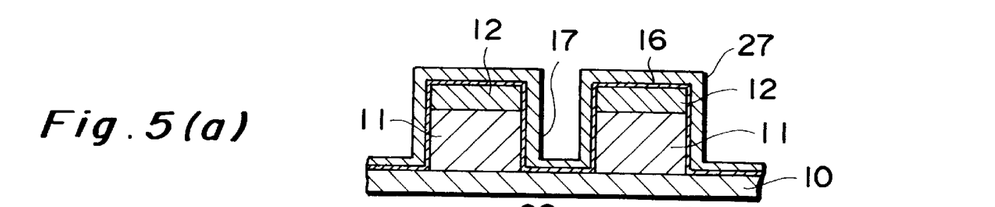
FIGS. 5(a) to 5(l) are sectional views showing a sequence of a still further semiconductor device manufacturing method according to the present invention.
Figure 6A:
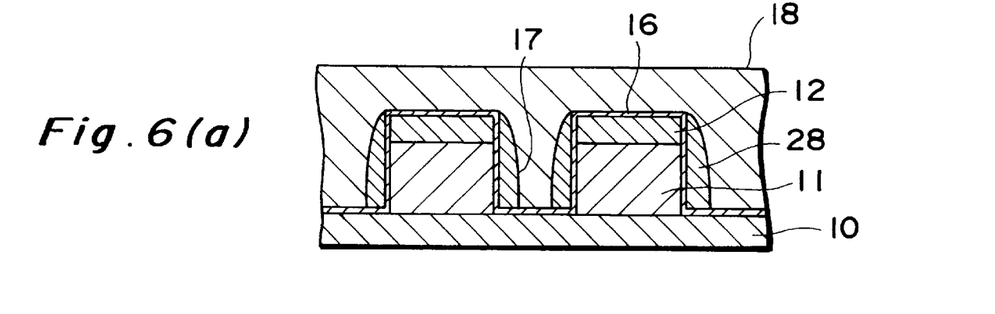
FIGS. 6(a) to 6(c) are sectional views showing a sequence of an additional semiconductor device manufacturing method according to the present invention.
Figure 6B:
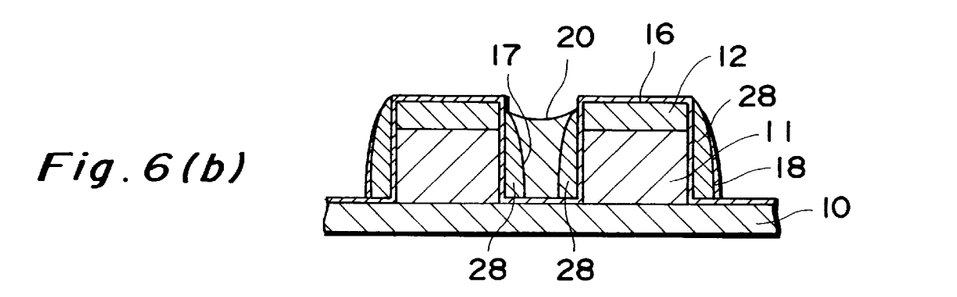
Figure 6C:
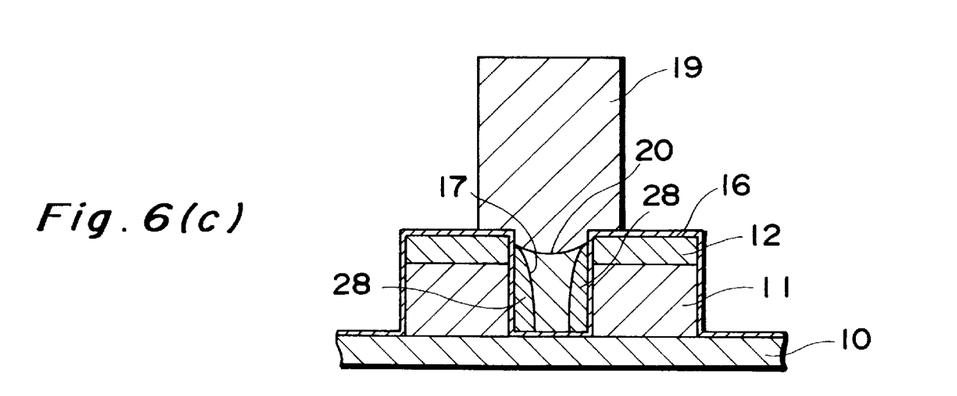

As shown in FIG. 5(a), at least a pair of gates 11 of MOS transistors are formed on the silicon semiconductor substrate 10. On each gate 11, there remains the protective film 12 formed by a silicon nitride film, which was used as the mask when the gate was formed. The gates 11 and that portion of surface of the semiconductor substrate 10 which is exposed between the gates 11 are covered with an etching stopper film 16 made of silicon oxide (NSG). The etching stopper film 16 is deposited by CVD to a thickness of about 500 A.U.

In the example illustrated, to form the mask used for the secondary ion implantation mentioned above, on the etching stopper film 16, a polysilicon layer 27 is deposited by CVD, for example, to a thickness of 1000 A.U. If the secondary ion implantation is obviated, the polysilicon layer 27 is dispensed with.

Figure 5B:
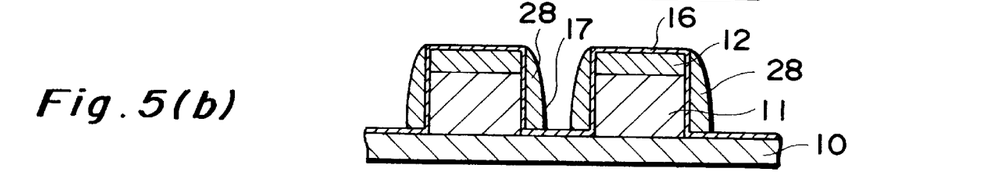

When the polysilicon layer 27 receives dry etching by a plasma gas including Cl2, the only polysilicon on the side walls of the gates 11 is left as the side wall portions 28 of polysilicon. The side wall portions 28 are used as the mask in the secondary ion implantation into the sources and the drain formed in the semiconductor substrate 10, which are not illustrated in FIG. 5.

Figure 5C:
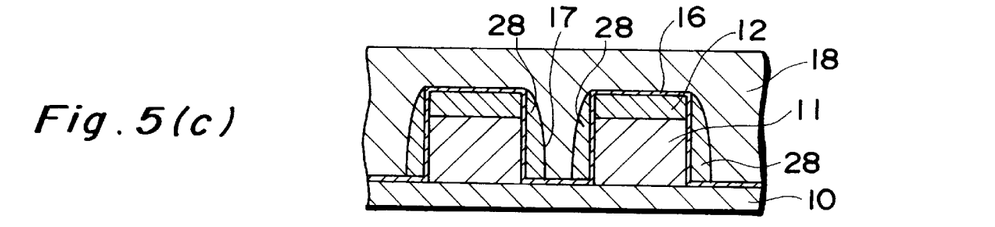
Figure 5D:
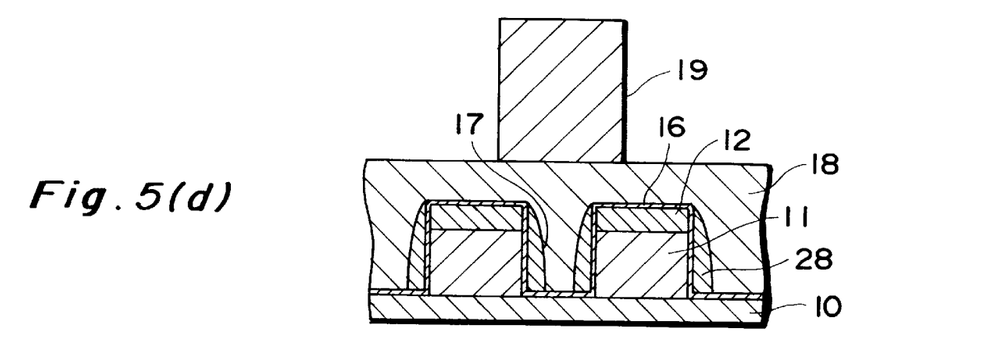

After secondary ions are injected, as shown in FIG. 5(c), polysilicon 18 is deposited by CVD, for example, to a thickness of 2000 A.U. to fill up the recess 17 between a pair of gates 11. On the polysilicon 18, a resist pattern 19 as shown in FIG. 5(d) is formed by photolithography, for example. The resist pattern 19 has the outside diameter smaller than the bore diameter of the preliminary opening 24 as in the example shown in FIG. 1(c), and is located at an appropriate position above the recess 17.

Figure 5E:
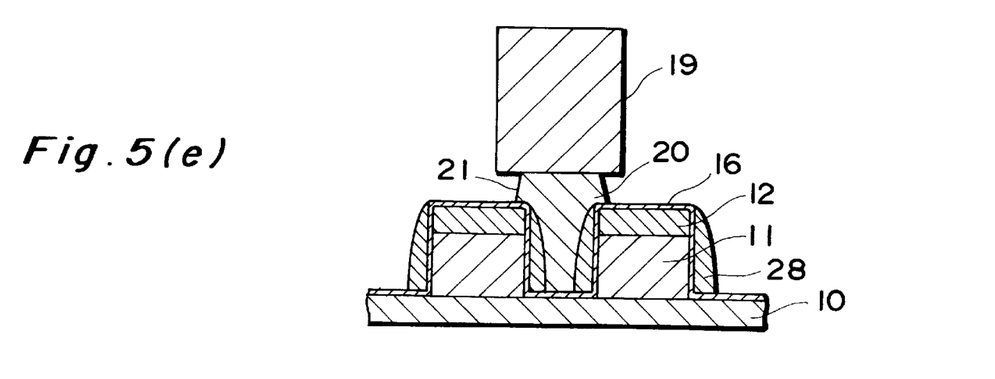

A plug 20 having a shoulder portion 21 made of polysilicon is formed as shown in FIG. 5(e) by dry etching with a plasma gas including SF6 and Cl2, for example, to etch the polysilicon in an isotropic mode of etching with the resist pattern 19 used as the mask.

Figure 5F:
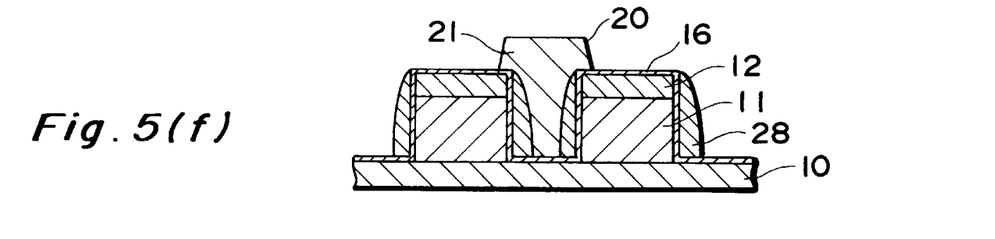

After the plug 20 is formed, the resist pattern 19 is removed with an asher, for example, as shown in FIG. 5(f), and ashing residues are also removed with sulfuric acid and oxygenated water.

Then, the shoulder portion 21 of the plug 20 is removed by dry etching with the first plasma gas including CF4, CHF3 and Ar, for example.

Figure 5G:
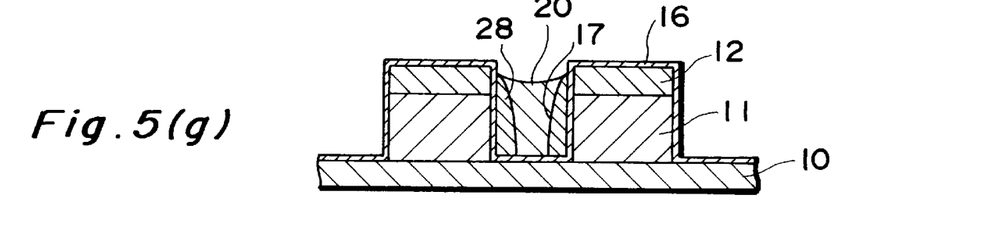

By the removal of the shoulder portion 21 by dry etching, as shown in FIG. 5(g), the plug is shaped to have a height lower than the portions of the etching stopper film 16 covering the top surfaces of the gates 11 and almost at the same level as the protective film 12 above the gates 11. During this etching step, the outer side wall of two side walls 28 of each gate 11 is also removed.

Figure 5H:
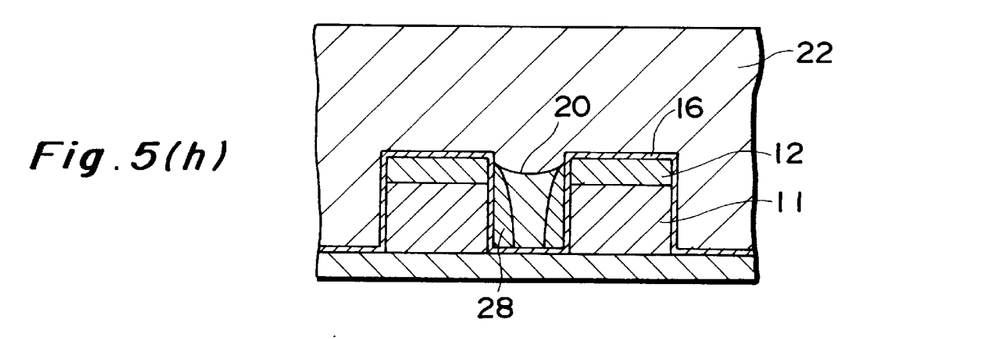

Subsequently, as shown in FIG. 5(h), the etching stopper film 16 covering the gates 11 and the plug 20 are embedded again in an insulating film 22 made of silicon oxide, such as BPSG.

Figure 5I:
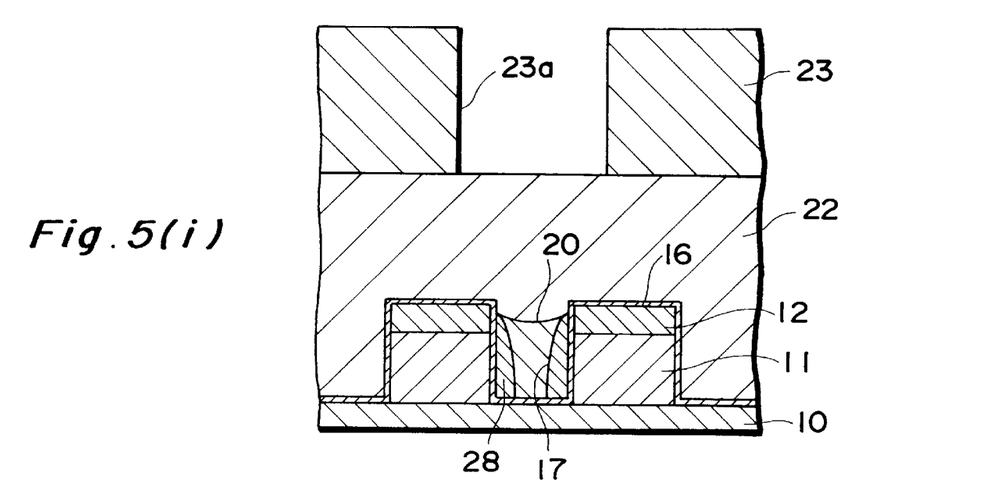

On this insulating film 22, a resist pattern 23 having an opening 23a for a preliminary opening 24 is formed as shown in FIG. 5(i).

Anisotropic dry etching is performed to form the preliminary opening 24 in the insulating film 22 with the resist pattern 23 used as the mask. For this dry etching, a plasma gas including CF4M CHF3 and Ar, for example, is used. The properties of the plasma gas are such that the etch rate of the insulating film 22 of silicon oxide is higher than the etch rate of the polysilicon plug 20 covering the etching stopper film 16 and the selectivity ratio of the insulating film 22 to the plug 20 is 20:1, for example, as mentioned earlier.

Figure 5J:
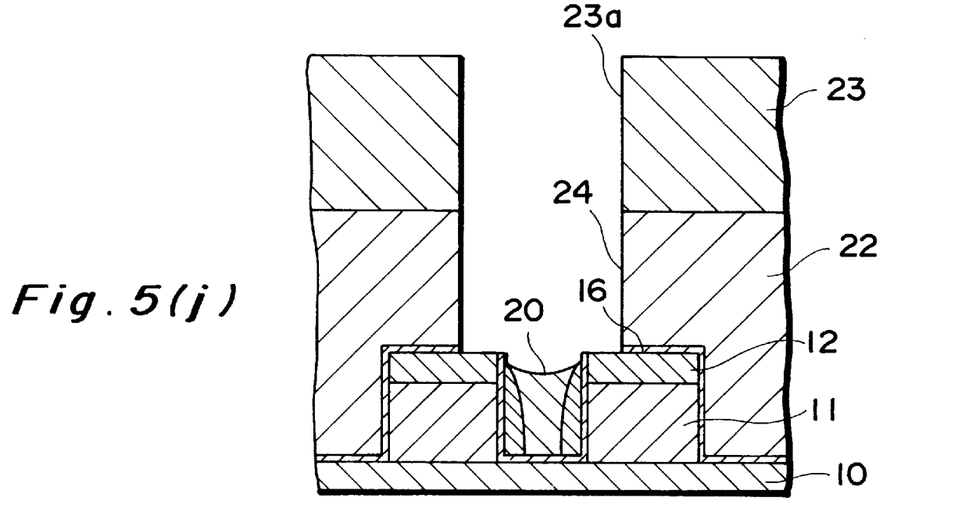

By using an etching gas which etches the insulating film 22 faster than the plug 20, the preliminary opening 24 can be formed appropriately without causing a substantial damage to the plug 20, therefore, without causing such a large damage to that portion of the etching stopper film 16, which is protected by the plug 20, as to expose the gates 11 as shown in FIG. 5(j).

After the preliminary opening 24 is formed, the resist pattern 23 is removed with an asher, for example. After that, the plug 20 exposed to the preliminary opening 24 is removed by dry etching with the second etching gas.

In the example in FIGS. 5(a) to 5(l), in which the etching stopper film 16 is formed of silicon oxide, the second etching gas is used, the properties of which are such that the etch rate of the polysilicon plug 20 is higher than the etch rate of the insulating film 22 and the etching stopper film 16 of the same quality as the insulating film 22. This second etching gas exhibits a large etch selectivity ratio of the plug 20 to the insulating film 22 and the etching stopper film 16, namely, larger than 50:1. For this second etching gas, a plasma gas, including SF6, similar to the one described earlier, can be used.

Figure 5K:
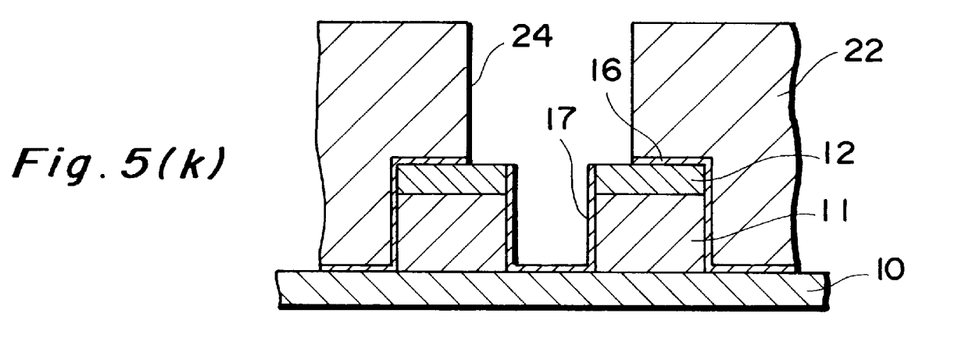
Figure 5L:
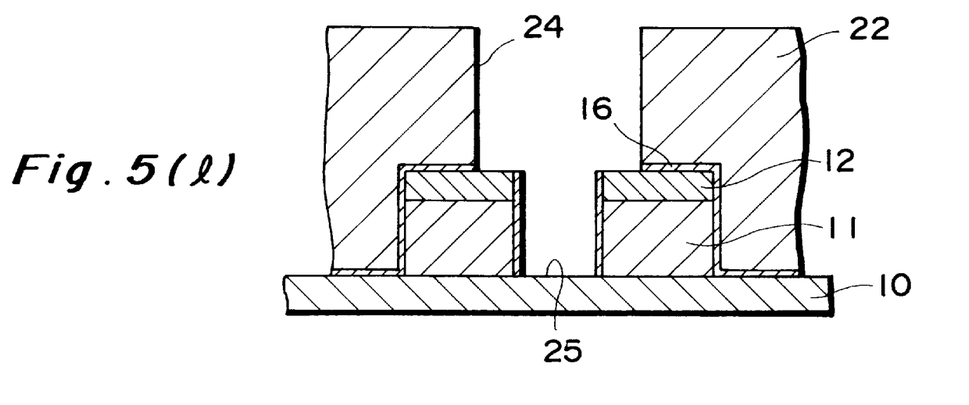

By dry etching with this second etching gas, the plug 20 can be removed relatively easily without causing a substantial damage to the etching stopper film 16 as shown in FIG. 5(k).

After the plug 20 is removed, the portion of the etching stopper film 16 which is located on the semiconductor substrate 10 and exposed to the recess 17 is removed with the third etching gas, so that a contact hole 25 including the preliminary opening 24 is formed.

When the etching stopper film 16 is formed of silicon oxide as mentioned above, as the third etching gas, an etching gas is used, the properties of which are such that the etch rate of the etching stopper film 16 of silicon oxide is higher than the etch rate of the semiconductor substrate 10 of silicon crystal. For this third etching gas, a plasma gas including CF4, CHF3 and Ar can be used, which is the same as the first etching gas mentioned above.

In the example shown in FIGS. 5(a) to 5(l), in which the etching stopper film 16 is a silicon oxide film, as in the example shown in FIGS. 1 to 4, in which the etching stopper film 16 is a silicon nitride film, when the preliminary opening 24 is formed, the etching stopper film 16 is protected by the plug 20 from the dry etching process. Therefore, as in the example shown in FIGS. 7 to 9, the preliminary opening 24 can be formed without causing a substantial damage to the etching stopper film 16, so that it is possible to reliably prevent the above-mentioned short circuit of the gates 11 resulting from damage of the etching stopper film 16.

Also in the example in which the etching stopper film 16 is a silicon oxide film, as described with reference to FIGS. 3(a) to 3(c), the plug 20 without the shoulder portion can be formed directly in the recess 17 between a pair of gates 11.

More specifically, as shown in FIG. 6(a), at least a pair of gates 11 of MOS transistor are formed on the silicon substrate 10. As shown in the example shown in FIG. 6(a), the protective film 12 formed of a silicon nitride film and used as the mask for forming the gates remains on the gates 11, and the gates 11 and that portion of the surface of the semiconductor substrate 10 which is exposed between the gates 11 are covered with the etching stopper film 16 made of silicon oxide (NSG). Side wall portions 28 made of the polysilicon layer 27, which were used as the mask in the secondary ion implantation, are formed on both sides of each gate 11.

Polysilicon 18 is deposited to a thickness of 2000 A.U. by CVD, for example, to fill up the recess 17 between a pair of gates 11 covered with the side wall portions 28.

The whole surface of the polysilicon 18 is subjected to etching without a mask by a plasma gas, including SF6 and Cl2, which is the same gas used in the removal of the shoulder portion 21 of the plug 20. Consequently, as shown in FIG. 6(b), owing to the microloading effect and so on, the polysilicon 18 remains in the recess 17, and a plug 20 can be obtained which has a height lower than the portion of the etching stopper film 16 which covers the top surfaces of the gates 11 and almost as high as the gates as has been described with reference to FIG. 3(b). At this time, the polysilicon 18 remains over the wall surfaces (28) of the side wall portions 28 of both sides of each of the pair of gates 11, and at that point the etching is stopped.

As shown in FIG. 6(c), the remaining polysilicon 18 is selectively removed by dry etching with an etching gas similar to the above-mentioned second etching gas, including SF6 and Cl2, and also with the resist pattern 19 formed covering the plug 20 as the mask.

Thereafter, as has been described with reference to FIGS. 5(h) to 5(l), the resist pattern 19 is removed, and the etching stopper film 16 covering the gates 11 and the plug 20 are embedded again in an insulating film 22 of silicon oxide.

To form a preliminary opening 24 in the insulating film 22 with a mask a resist pattern 23 formed on the insulating film 22, dry etching is performed with a first plasma gas including CF4, CHF3 and Ar.

Because during the forming step of the preliminary opening 24 a specified portion of the etching stopper film 16 is securely covered with the plug 20 and therefore the specified portion is protected from an etching gas, the preliminary opening 24 can be formed appropriately without causing a substantial damage to the etching stopper film 16.

After the preliminary opening 24 is formed, following the removal of the resist pattern 23, the plug 20 exposed to the preliminary opening 24 is removed by dry etching with a second etching gas including SF6 and Cl2.

After removal of the plug 20, that portion of the etching stopper film 16 which is located on the semiconductor substrate 10 and exposed to the recess 17 is removed with the first etching gas, so that a contact hole 25 including the preliminary opening 24 is completed.

This method for etching the whole surface of the polysilicon 18 to form the plug 20 and directly forming the plug 20 without the shoulder portion is, as mentioned above, favorable for forming an appropriate plug 20 because the residual quantity of the polysilicon plug 20 can be decided more easily as the quantity relative to the whole mass of the polysilicon 18 than in the method for removing only the shoulder portion 21 after the plug 20 with the shoulder portion has been formed.

With regard to the method shown in FIGS. 5 and 6, in which the etching stopper film 16 is made of silicon oxide, description has been made of a case where the side wall portions (28) made of the same material as the plug 20 are formed on the outside of the etching stopper film 16. The side wall portions (28) in cooperation with the plug 20 fill up the recess 17 between the gates 11.

Therefore, compared with the method filling a minute recess 17 with a single plug 20, it is favorable to adopt side wall portions (28) to fill up the recess 17 in cooperation with the plug 20 because this method is adaptable to higher density device integration.

The constituents of the first, second and third etching gases are not limited to the examples mentioned above, but may include additional required constituents if necessary. The above-mentioned manufacturing methods according to the present invention are not limited to MOS transistors, but may be applied to the manufacture of various semiconductor devices requiring gates.

According to the present invention, by adopting a plug for protecting the etching stopper film from an etching gas when forming a preliminary opening by etching the insulating film which has the electrical insulating etching stopper film embedded therein, the etching stopper film is reliably prevented from suffering damage which conventionally used to occur in the process of forming the preliminary opening in the insulating film.

When removing the plug exposed to the preliminary opening, the plug can be effectively removed without causing a substantial damage to the etching stopper film by the use of an etching gas which has a higher selectivity ratio of the plug to the etching stopper film than the insulating film/etching stopper film selectivity of the etching gas conventionally used for forming the preliminary opening.

Therefore, the forming of a contact hole in a self-aligned manner can be realized relatively easily without causing a short-circuit of the gate resulting from damage of the etching stopper film, so that high density semiconductor devices can be manufactured relatively easily.

What is claimed is:

1. A method of manufacturing a semiconductor device, including a process of forming a contact hole, opened above a semiconductor substrate between a pair of gates, in an insulating film having embedded therein said pair of gates formed spaced apart from each other on said semiconductor substrate, comprising the steps of:

forming an etching stopper film having electrical insulating properties to cover said gates formed on said semiconductor substrate and exposed surfaces of said semiconductor device;

filling with a plug a recess covered with said etching stopper film and defined between said gates by said gates;

forming said insulating film to have said etching stopper film and said plug formed partially on said etching stopper film embedded therein;

forming in said insulating film a preliminary opening having said plug exposed thereto by etching said insulating film with a first etching gas having an insulating film/plug selectivity ratio and with a mask;

removing said plug exposed to said preliminary opening with a second etching gas having a selectivity ratio of said plug to said insulating film and said etching stopper film, higher than said selectivity ratio of said first etching gas; and removing that portion of said stopper film which has been exposed by said plug etching step and which is located on said semiconductor substrate, with a third etching gas having a selectivity ratio of said etching stopper film to said semiconductor substrate, thereby forming said contact hole open above said semiconductor substrate.

2. A method of manufacturing a semiconductor device according to claim 1, wherein said plug has a shoulder portion extending above said pair of gates.

3. A method of manufacturing a semiconductor device according to claim 2, wherein a protective film is formed on the top portion of each gate, wherein said etching stopper film formed to cover said gates and said exposed surfaces of said semiconductor substrate also covers said protective film on the top portion of each gate, wherein said shoulder portion of said plug is removed before said plug is embedded in said insulating film, and said plug now shaped such that its height is almost the same as the pair of gates is embedded in the insulating film.

4. A method of manufacturing a semiconductor device according to claim 3, wherein said semiconductor substrate is a silicon crystal substrate, said plug is made of polysilicon, and said insulating film is made of silicon oxide.

5. A method of manufacturing a semiconductor device according to claim 4, wherein said protective film is a silicon oxide film, and said etching stopper film is a silicon nitride film.

6. A method of manufacturing a semiconductor device according to claim 4, wherein said protective film is a silicon nitride film, and said etching stopper film is a silicon oxide film.

7. A method of manufacturing a semiconductor device according to claim 5, wherein said first etching gas is a plasma gas, including CF4, CHF3 and Ar, said second etching gas is a plasma gas, including SF6, and said third etching gas is a plasma gas, including CF4 and O2.

8. A method of manufacturing a semiconductor device according to claim 6, wherein said first etching gas is a plasma gas, including CF4, CHF3 and Ar, said second etching gas is a plasma gas, including SF6, and said third etching gas is a plasma gas, including CF4, CHF3 and Ar.

\* \* \* \* \*